United States Patent
Han et al.

(10) Patent No.: US 10,653,050 B2
(45) Date of Patent: May 12, 2020

(54) ELECTRONIC MODULE AND VEHICLE HAVING THE SAME

(71) Applicants: Hyundai Motor Company, Seoul (KR); Kia Motors Corporation, Seoul (KR); Industry-Academic Cooperation Foundation Gyeongsang National University, Jinju, Gyeongsangnam-do (KR)

(72) Inventors: SeungHyun Han, Gyeonggi-do (KR); Jongpil Kim, Gyeonggi-do (KR); Yongoh Choi, Gyeongsangnam-do (KR); Wongyu Seol, Gyeongsangnam-do (KR); Se-Kyo Chung, Gyeongsangnam-do (KR)

(73) Assignees: Hyundai Motor Company, Seoul (KR); Kia Motors Corporation, Seoul (KR); Industry-Academic Cooperation Foundation Gyeongsang National University, Jinju, Gyeongsangnam-do (KR)

( * ) Notice: Subject to any disclaimer, the term of this patent is extended or adjusted under 35 U.S.C. 154(b) by 220 days.

(21) Appl. No.: 15/830,020

(22) Filed: Dec. 4, 2017

(65) Prior Publication Data

US 2019/0029148 A1 Jan. 24, 2019

(30) Foreign Application Priority Data

Jul. 19, 2017 (KR) .................. 10-2017-0091288

(51) Int. Cl.
*H05K 9/00* (2006.01)
*B60R 16/03* (2006.01)
(Continued)

(52) U.S. Cl.
CPC ........... *H05K 9/0071* (2013.01); *B60R 16/03* (2013.01); *H01F 27/24* (2013.01); *H01F 27/2804* (2013.01); *H05K 1/165* (2013.01); *H01F 2027/2809* (2013.01); *H05K 1/0216* (2013.01); *H05K 1/0298* (2013.01); *H05K 2201/10151* (2013.01)

(58) Field of Classification Search
CPC . B60R 16/03; H01F 27/24; H01F 2027/2809; H05K 2201/10151; H05K 9/0071; H05K 1/0216; H05K 1/165
See application file for complete search history.

(56) References Cited

U.S. PATENT DOCUMENTS

| 2009/0027136 | A1* | 1/2009 | Traa | ................ | H03H 11/10 |
| | | | | | 333/12 |
| 2015/0263694 | A1* | 9/2015 | Sun | .................. | H05K 1/18 |
| | | | | | 320/109 |

* cited by examiner

*Primary Examiner* — Jared Fureman
*Assistant Examiner* — Duc M Pham
(74) *Attorney, Agent, or Firm* — Mintz Levin Cohn Ferris Glovsky and Popeo, P.C.; Peter F. Corless

(57) ABSTRACT

A vehicle electronic module is provided. The vehicle electronic module has a reduced size and improved productivity by replacing a sensor and an offset unit of an electromagnetic interference (EMI) filter module with a printed circuit board (PCB) winding structure. The electronic module includes a sensor that detects EMI noise of a power line and an offset unit that transmits an offset voltage for removing the EMI noise to the power line. A controller is configured to generate the offset voltage that corresponds to the EMI noise detected by the sensor. Then sensor and the offset unit are formed in a stacked structure of the PCB.

18 Claims, 18 Drawing Sheets

(51) Int. Cl.
*H01F 27/24* (2006.01)
*H01F 27/28* (2006.01)
*H05K 1/16* (2006.01)
*H05K 1/02* (2006.01)

ELECTRONIC MODULE AND VEHICLE HAVING THE SAME

CROSS-REFERENCE TO RELATED APPLICATION

This application claims the benefit of Korean Patent Application No. 10-2017-0091288, filed on Jul. 19, 2017 the disclosure of which is incorporated herein by reference.

BACKGROUND

1. Field of the Disclosure

The present disclosure relates to a vehicle electronic module and a vehicle having the same, and more particularly, to a technique of removing electromagnetic interference (EMI) generated in a vehicle.

2. Description of the Related Art

Since a power converter for an electric vehicle (e.g., a converter, a slow charger, and the like) uses a high-speed switching scheme to generate a desired type of voltage, an EMI filter for reducing noise generated due to changes in voltage and current is essential. A conventional EMI filter utilizes passive components including a common mode (CM) choke, a Y-capacitor and an X-capacitor. In a passive EMI filter, the CM choke and the Y-capacitor are used for reducing CM noise, and the CM noise reduction is an important factor in the design of a power line filter. The CM choke uses a toroidal type core. Since the CM choke requires a high-grade core to achieve a high attenuation rate, the size and price of the CM choke are increased. In addition, the winding is assembled manually, there is a restriction on performance uniformity and mass productivity. Accordingly, although a high attenuation rate may be implemented by increasing the capacity of the Y-Capacitor, a leakage current of the Y-Capacitor may be increased when the capacity is increased, and thus there is a restriction on the use of capacity.

Research and development on an active EMI filter has been conducted to overcome the restriction on the passive EMI filter. An active EMI filter, which senses a voltage or current of CM noise in a power line to actively offset the noise, includes a noise sensing circuit, an offset circuit, and a control circuit. The sensing circuit and the offset circuit used in the active EMI filter may utilize a CM choke or a capacitor and the active EMI filters may be classified into a voltage sensing voltage offset type filter, a voltage sensing current offset type filter, a current sensing voltage offset type filter, and a current sensing current offset type filter based on the topology.

It should be understood that the foregoing description of the background art is merely for the purpose of promoting an understanding of the background of the present disclosure and is not to be construed as an admission that the prior art is known to those skilled in the art.

SUMMARY

The present disclosure provides a vehicle electronic module having a variable size and that is superior in productivity by replacing an offset part of an active EMI filter module with a printed circuit board (PCB) winding structure, and a vehicle having the same.

In an aspect of an exemplary embodiment of the present disclosure, an electronic module may include a sensor configured to detect common mode electromagnetic interference (EMI) noise of a power line, an offset unit configured to transmit an offset voltage for removing the EMI noise to the power line, and a controller configured to generate the offset voltage that corresponds to the EMI noise detected by the sensor. The sensor and the offset unit may be formed in a stacked structure of at least one PCB.

In some exemplary embodiments, the offset unit may include a first winding configured to receive the offset voltage generated by the controller, a second winding configured to transform the offset voltage and supply the transformed voltage to the power line, and a core configured to electrically connect the first winding and the second winding. The offset unit may include a first PCB that forms the first winding, a second PCB that forms the second winding, and a third PCB that forms the core.

The controller may include an operational amplifier and a transistor. The controller may include a resistor and may be configured to generate the offset voltage that corresponds to the EMI noise based on the resistor. The controller may be dispose on the PCB together with the first winding or the second winding.

In other exemplary embodiments, a wiring structure may be formed on the PCB based on a turn ratio of the offset unit. The PCB may include an aperture structure that electrically connects the PCB to a second PCB. The electronic module may further include a passive component configured to remove the EMI noise.

In accordance with another aspect of an exemplary embodiment of the present disclosure, a vehicle may include a power source configured to supply power to the vehicle, a power line configured to transmit the power supplied from the power source to the vehicle, a sensor configured to detect electromagnetic interference (EMI) noise of the power line, an offset unit configured to transmit an offset voltage for removing the EMI noise to the power line, and a controller configured to generate the offset voltage that corresponds to the EMI noise detected by the sensor. The sensor and the offset unit may be formed in a stacked structure of the PCB.

The offset unit may include a first winding configured to receive the offset voltage generated by the controller, a second winding configured to transform the offset voltage and supply the transformed voltage to the power line, and a core configured to electrically connect the first winding and the second winding. The offset unit may include a first PCB that forms the first winding, a second PCB that forms the second winding, and a third PCB that forms the core.

The controller may include an operational amplifier and a transistor. The controller may include a resistor configured to generate the offset voltage that corresponds to the EMI noise based on the resistor. The controller may be disposed on one PCB together with the first winding or the second winding.

A wiring structure may be formed on the PCB based on a turn ratio of the offset unit. The PCB may include an aperture structure configured to electrically connect the PCB to a second PCB. The vehicle may further include a passive component configured to remove the EMI noise.

BRIEF DESCRIPTION OF THE DRAWINGS

These and other aspects of the disclosure will become apparent and more readily appreciated from the following description of the exemplary embodiments, taken in conjunction with the accompanying drawings of which:

FIG. 5 is an exemplary circuit diagram of an offset unit in accordance with an exemplary embodiment of the present disclosure;

DETAILED DESCRIPTION

Figure 1:
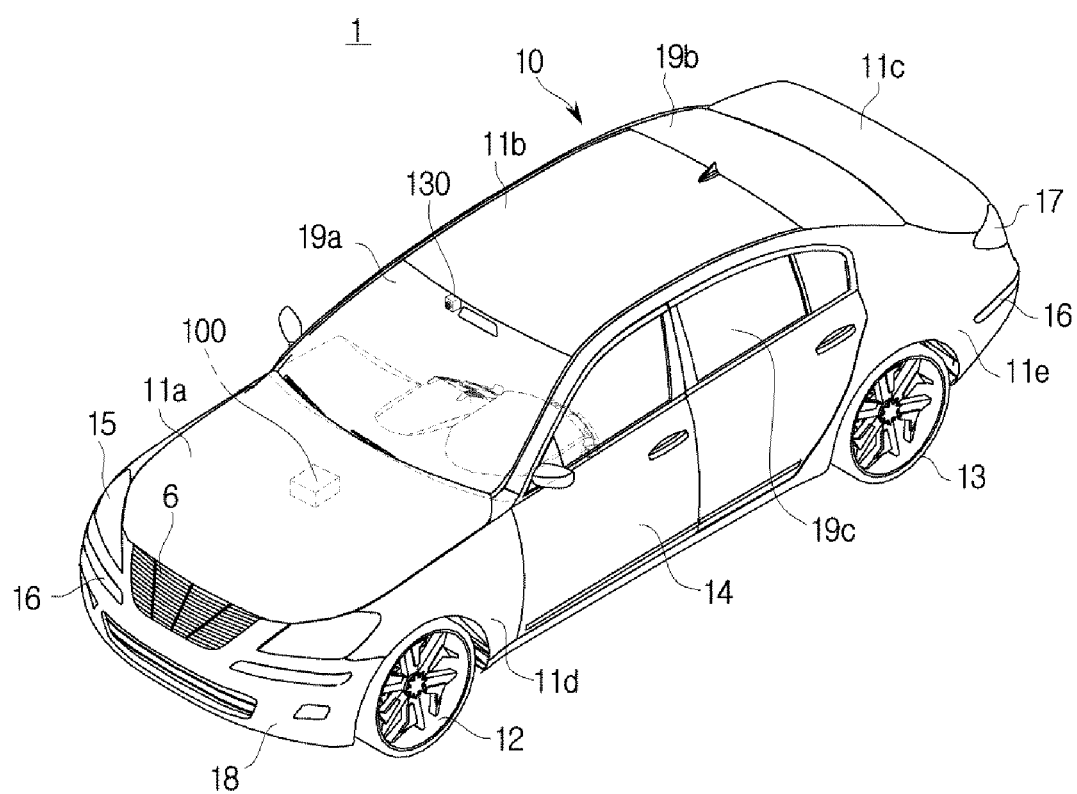
FIG. 1 is an exemplary view illustrating an exterior of a vehicle in accordance with an exemplary embodiment of the present disclosure.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, in order to make the description of the present disclosure clear, unrelated parts are not shown and, the thicknesses of layers and regions are exaggerated for clarity. Further, when it is stated that a layer is "on" another layer or substrate, the layer may be directly on another layer or substrate or a third layer may be disposed therebetween.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Like reference numerals refer to like elements throughout the specification. The specification does not describe all the elements of the exemplary embodiments, and the general content of the related art and duplicative content in the exemplary embodiments will be omitted. Components indicated by the terms "unit," "module," "member," and "block" used in the specification may be implemented by hardware or software. It is also possible for a plurality of units, modules, members, and blocks to be implemented as one component, or for one unit, module, member, or block to include a plurality of elements in accordance with the embodiments.

It will be understood that when an element is referred to as being "connected" to another element, it may be directly connected or indirectly connected through another element. The indirect connection includes connection through a wireless communication network. In addition, when a part 'includes' some elements, unless explicitly described to the contrary, it does not mean that other elements are excluded but such elements may be further included. Terms, such as "first," "second," etc., are for discriminating one component from another component, and the scope is not limited by such terms The reference characters used in the steps are used for the convenience of illustration, and do not limit the order of the steps, but the steps may be executed in different orders unless the order is specifically stated.

Hereinafter, the operational principle and embodiments of the present disclosure will be described with reference to the accompanying drawings.

FIG. 1 is an exemplary perspective view schematically illustrating an exterior of a vehicle in accordance with an exemplary embodiment. Referring to FIG. 1, a vehicle 1 may include a vehicle body 10 that defines the exterior and wheels 12 and 13 configured to move the vehicle 1. The vehicle body 10 may include a hood 11a that protects various devices required for driving the vehicle 1 such as an engine, a roof panel 11b that form an interior compartment, a trunk lid 11c that includes a storage compartment, front fenders 11d disposed on the sides of the vehicle 1, and quarter panels 11e. In addition, a plurality of doors 15 hinge-coupled to the vehicle body 10 are disposed on the sides of the vehicle body 10.

A front window 19a may be disposed between the hood 11a and the roof panel 11b to provide the field of vision forward from the vehicle 1 and a rear window 19b may be disposed between the roof panel 11b and the trunk lid 11c to provide the field of vision in the rearward direction behind the vehicle. In addition, a side window 19c may be disposed on an upper side of the door 15 to provide the field of vision in a lateral direction. In addition, headlamps 15 that provide illumination in a traveling direction of the vehicle 1 may be disposed on the front of the vehicle 1. Further, turn signal lamps that indicate the traveling direction of the vehicle 1 may be disposed at the front and rear of the vehicle 1. The vehicle 1 may indicate the travelling direction by flickering the turn signal lamp 16. In addition, tail lamps 17 may be disposed at the rear of the vehicle 1. The tail lamp 17 disposed at the rear of the vehicle 1 may indicate a gearshift state of the vehicle 1, a brake operation state, and the like.

At least one vehicle electronic module 100 may be disposed within the interior of vehicle 1. The vehicle electronic module 100 may be configured to perform an electronic control related to an operation of the vehicle 1. The vehicle electronic module 100 may be installed at a predetermined position within the vehicle 1 in accordance with the designer's selection. For example, a vehicle controller 102 may be disposed between an engine compartment and a dashboard or may be provided within a center fascia or in a trunk compartment. The vehicle electronic module 100 may include at least one processor configured to receive an electrical signal, processing the received electrical signal and outputs the processing result. The processor may be implemented with a semiconductor chip and related components. The semiconductor chip and the related components may be disposed on a printed circuit board (PCB) within the vehicle 1

Figure 2:
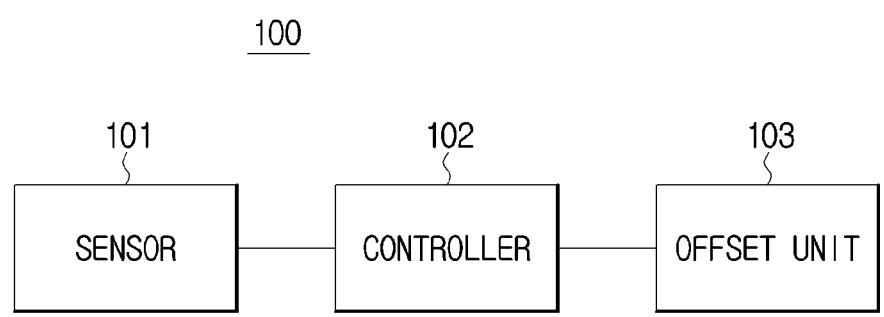
FIG. 2 is an exemplary control block diagram illustrating a vehicle electronic module in accordance with an exemplary embodiment of the present disclosure.

FIG. 2 is an exemplary control block diagram illustrating a vehicle electronic module 100 in accordance with an exemplary embodiment of the present disclosure. Referring to FIG. 2, the vehicle electronic module 100 may include a sensor 101, a controller 102, and an offset unit 103. The sensor 101 may be configured to measure a common mode electromagnetic interference (CM EMI) noise voltage of a power line. The EMI noise refers to a disturbance generated when an electromagnetic wave signal is affected by electromagnetic interference. The sensor 101 may be a high-pass filter. Additionally, the sensor 101 may include a passive component that may be a CM choke or a capacitor. The sensor 101 may be configured to detect an EMI noise voltage and transmit the detection result to the controller 102. The offset unit 103 may be configured to transmit an offset voltage to the power line to remove EMI noise. The offset voltage may be configured to remove the EMI noise, and refers to a voltage having the same magnitude as the EMI noise and polarity opposite the polarity of the EMI noise.

The sensor 101 and the offset unit 103 may include a first winding, a second winding, and a core. The sensor 101 and the offset unit 103 may have properties of a transformer. According to an exemplary embodiment of the present disclosure, the sensor 101 and the offset unit 103 may be formed in a stacked structure of PCBs. By forming the sensor 101 and the offset unit 103 in the stacked structure, the vehicle electronic module 100 having consistent performance may be manufactured. Additionally, since the sensor 101 and the offset unit 103 are formed in the PCB, the vehicle electronic module 100 may be formed in a reduced size. Further, the PCB that forms the sensor 101 and the offset unit 103 may be manufactured based on a required inductance value and a winding ratio. The details related to the required inductance value and the winding ratio will be described below.

The controller 102 may be configured to generate an offset voltage corresponding to EMI noise detected by the sensor 101. The controller 102 may be configured to output the offset voltage to remove the EMI noise detected by the sensor 101. The controller 102 may include an operational amplifier (Op-amp) and a transistor. In addition, the controller 102 may include at least one resistor, and a user may adjust the resistor and outputs the offset voltage. Further, the controller 102 may be disposed on a PCB. The controller 102 may be disposed on a PCB along with the offset unit 103 described above. Additionally, although the vehicle electronic module shown in FIG. 2 has been described with an example of a power line noise of a slow charger, the vehicle electronic module may be used for an inverter, a converter, and the like of various vehicles. Moreover, an electronic module may be applied to various electronic products other than the vehicle.

Figure 3:
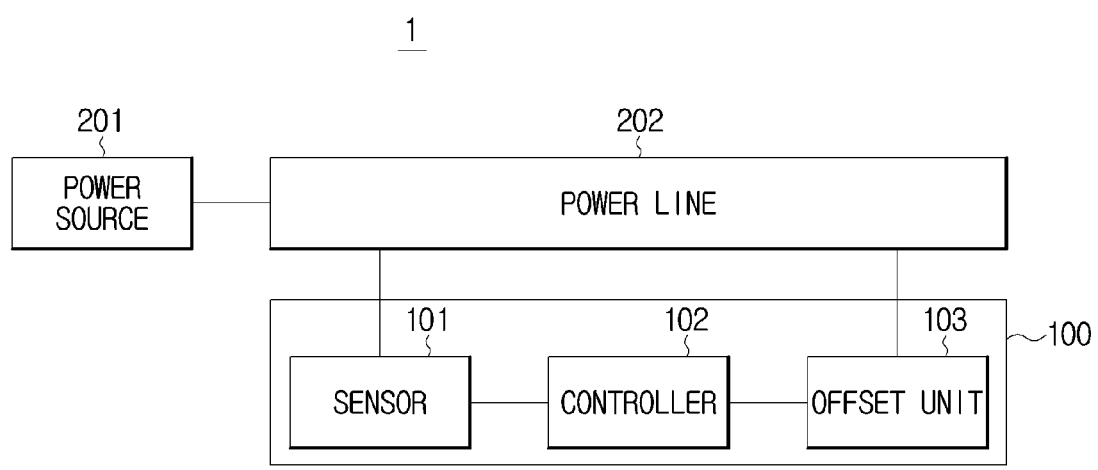
FIG. 3 is an exemplary control block diagram illustrating the vehicle in accordance with an exemplary embodiment of the present disclosure.

FIG. 3 is an exemplary control block diagram illustrating the vehicle in accordance with an exemplary embodiment of the present disclosure. Referring to FIG. 3, the vehicle may include the vehicle electronic module 100 shown in FIG. 2 and may include a power source 201 and a power line 202. The power source 201 may be configured to supply power to the vehicle. Generally, the power source 201 may have the standard of 220 V and 60 Hz, but the exemplary embodiment is not limited thereto. The power source 201 may be configured to supply electric energy to the vehicle through the power line 202. As described above, the vehicle electronic module 100 may be configured to measure EMI noise of the power line 202, and may be configured to generate and output an offset voltage for removing the EMI noise. Although not shown in FIG. 3, a circuit capable of removing noise using passive components (e.g., an inductor and a capacitance) may be disposed in the power source 201. The details thereof will be described below.

At least one component may be added or removed based on the performance of the components shown in FIGS. 2 and 3. In addition, it will be readily understood by those skilled in the art that relative positions of the components may be changed based on the performance or structure of the system.

Figure 4:
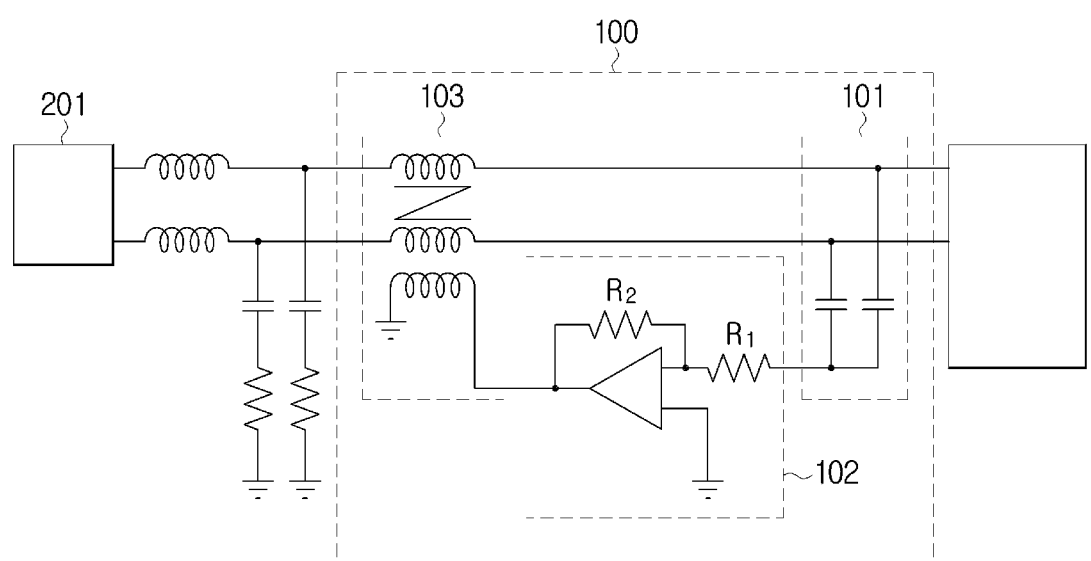
FIG. 4 is an exemplary circuit diagram in accordance with an exemplary embodiment of the present disclosure.

FIG. 4 is an exemplary circuit diagram in accordance with an exemplary embodiment of the present disclosure. Referring to FIG. 4, the power source 201, the power line 202, passive components, and the vehicle electronic module 100 are illustrated in FIG. 4. The power source 201 may be configured to supply electrical energy to the vehicle through the power line 202. The vehicle electronic module 100 may include the offset unit 103, the controller 102, and the sensor 101. EMI noise may be generated when the power source 201 supplies electrical energy through the power line 202. The EMI noise may be measured by the sensor 101. The sensor 101 may have properties of a high-pass filter. The sensor 101 may include a CM choke or a capacitor. The sensor 101 may be connected to the controller 102. Frequencies filtered by the sensor 101 may be set based on capacitance of the sensor 101 and resistance of the controller 102.

Further, the controller 102 shown in FIG. 4 may include an operational amplifier and two resistors R1 and R2. The controller 102 shown in FIG. 4 may be an inverting amplifier. An offset voltage output from the controller 102 may be adjusted based on a ratio of values of the resistors included in the controller 102. A gain calculated based on the resistors included in the controller 102 may be derived from the following Equation 1.

$$A1 = \frac{-R2}{R1} \quad \text{Equation 1}$$

Referring to Equation 1, A1 denotes the gain of the controller 102 and R1 and R2 denote resistance values of the resistors included in the controller 102. Thus, a value of the offset voltage output from the controller 102 may be adjusted by adjusting the values of R1 and R2. Additionally, the sensor 101 and the offset unit 103 may be formed in the form of a transformer as shown in FIG. 4, which will be described in detail below. The passive components (e.g., an inductor, a capacitor, and a resistor) may be connected to the vehicle electronic module 100 to remove noise.

Figure 5A:
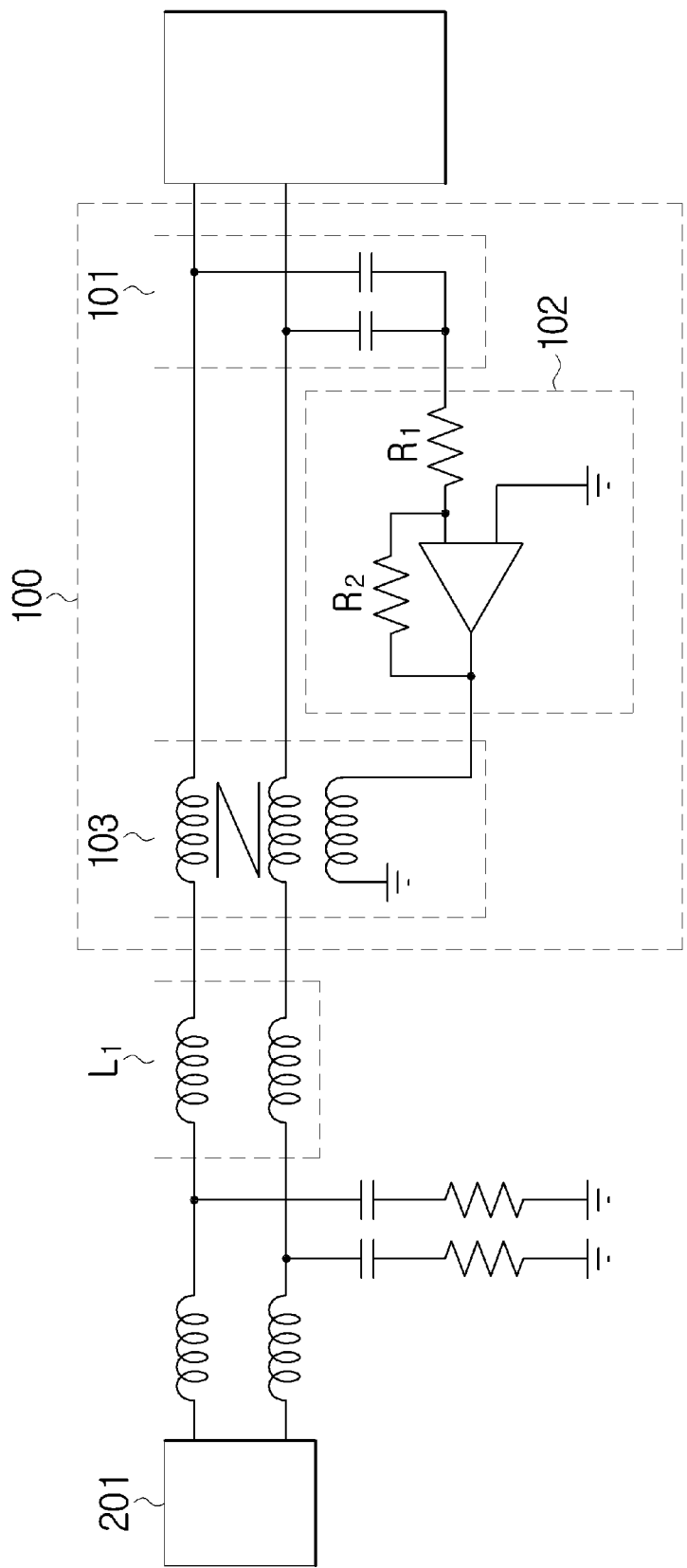
FIGS. 5A and 5B are exemplary circuit diagrams in accordance with another exemplary embodiment of the present disclosure.
Figure 5B:
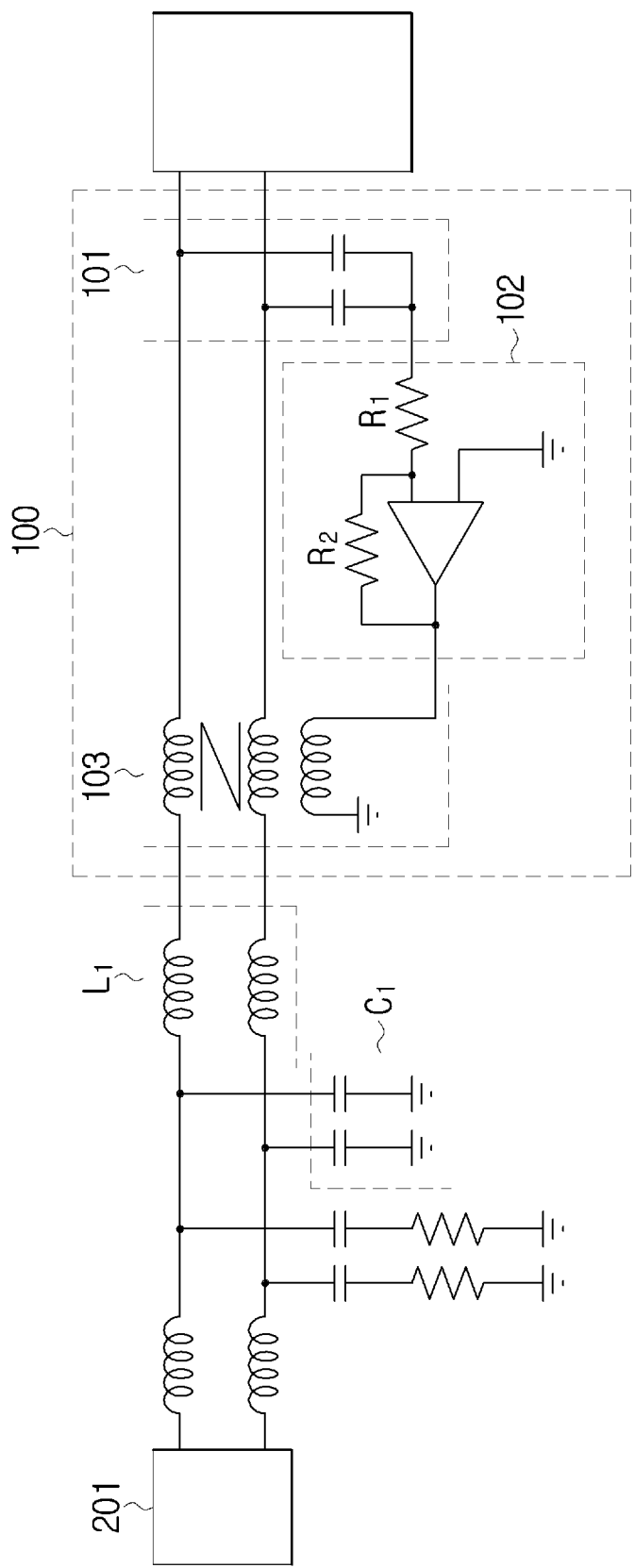

FIGS. 5A and 5B are exemplary circuit diagrams in accordance with another exemplary embodiment of the present disclosure. FIG. 5A is an exemplary circuit diagram in which an inductor L1 is included in external passive components of the vehicle electronic module 100 shown in the circuit of the circuit of FIG. 4. FIG. 5B is an exemplary circuit diagram in which an inductor L1 and a capacitor C1 are further added to the circuit of FIG. 4. Although the vehicle electronic module 100 may include an active circuit having an operational amplifier, the noise may be more effectively removed through the passive components that may include the inductor L1 and the capacitance C1 in the circuits shown in FIGS. 5A and 5B.

Figure 6A:
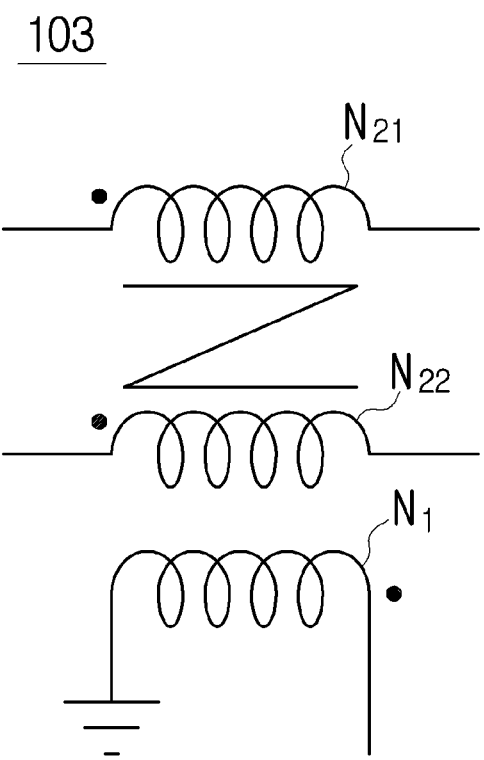
FIGS. 6A and 6B are exemplary views for describing an operation of an offset unit in accordance with an exemplary embodiment of the present disclosure.
Figure 6B:
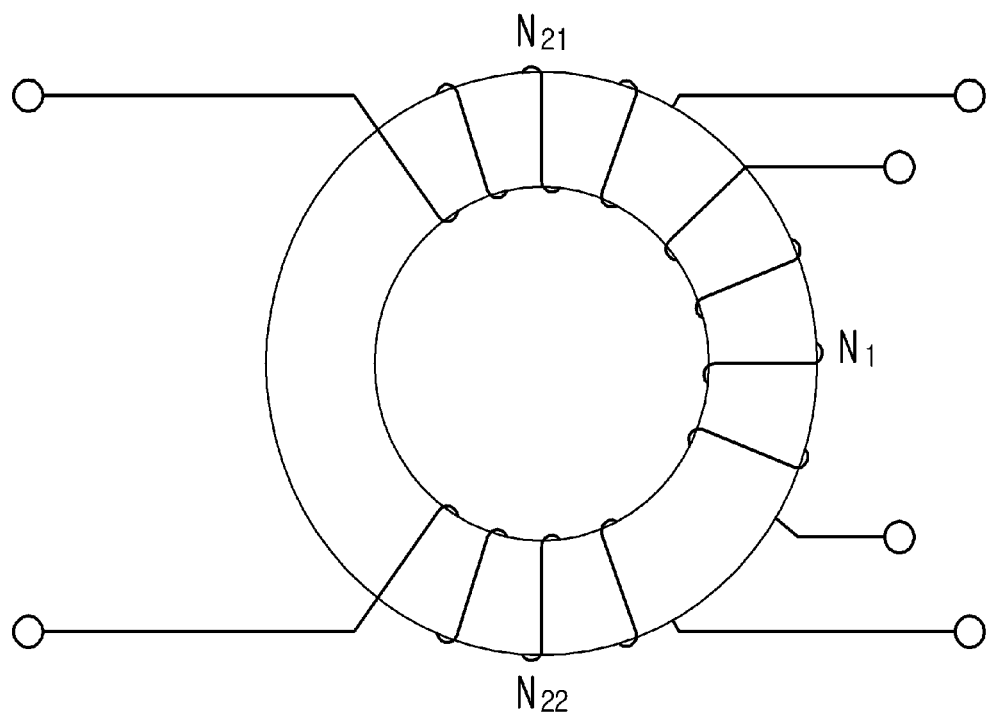

FIGS. 6A and 6B are exemplary views for describing operations of the sensor 101 and the offset unit 103 in accordance with an exemplary embodiment of the present disclosure. FIGS. 6A and 6B are enlarged views of a voltage unit of the vehicle electronic module 100. As described above, although the sensor 101 and the offset unit 103 may be formed as a layer structure of a PCB, the sensor 101 and the offset unit 103 may have substantially the same function as a transformer. The sensor 101 and the offset unit 103 may include a first winding and a second winding which are electrically connected to each other through a core. The first winding may be connected to the controller 102, and the second winding may be connected to the power line.

FIG. 6B is an exemplary detailed view illustrating the core between the sensor 101 and the offset unit 103 shown in FIG. 6A. The first and second windings may be electrically connected to each other through the core. The sensor 101 and the offset unit 103 may include one first winding unit, two second windings, and a common core. In addition, the sensor 101 and the offset unit 103 may be configured to induce a voltage from the first winding to the second windings. The first and second windings may be formed in a PCB which will be described below. Further, the core may be formed of a magnetic material (e.g., nano-crystals, a metal powder, ferrite, or the like) and the type of material that form the core is not limited provided the first and second windings are electrically connected to each other through the core.

In addition, a magnitude of a transmission voltage may vary based on a turn ratio between the sensor 101 and the offset unit 103. A total gain output from the sensor 101 and the offset unit 103 may be derived from the following Equation 2.

$$A2 = \frac{R2}{R1} \times \frac{N21}{N1} = \frac{R2}{R1} \times \frac{N22}{N1} \qquad \text{Equation 2}$$

Referring to Equation 2, R2 and R1 are resistance values in the controller 102 as described above, N1 denotes a winding value of the first winding, and N21 and N22 denote winding values of the second windings. A voltage passing through the controller 102, the sensor 101, and the offset unit 103 may be used to remove EMI noise based on Equation 2. The operation of the above-described transformer is an example for describing an exemplary embodiment of the present disclosure, and the operation of the present disclosure is not limited thereto.

Figure 7A:
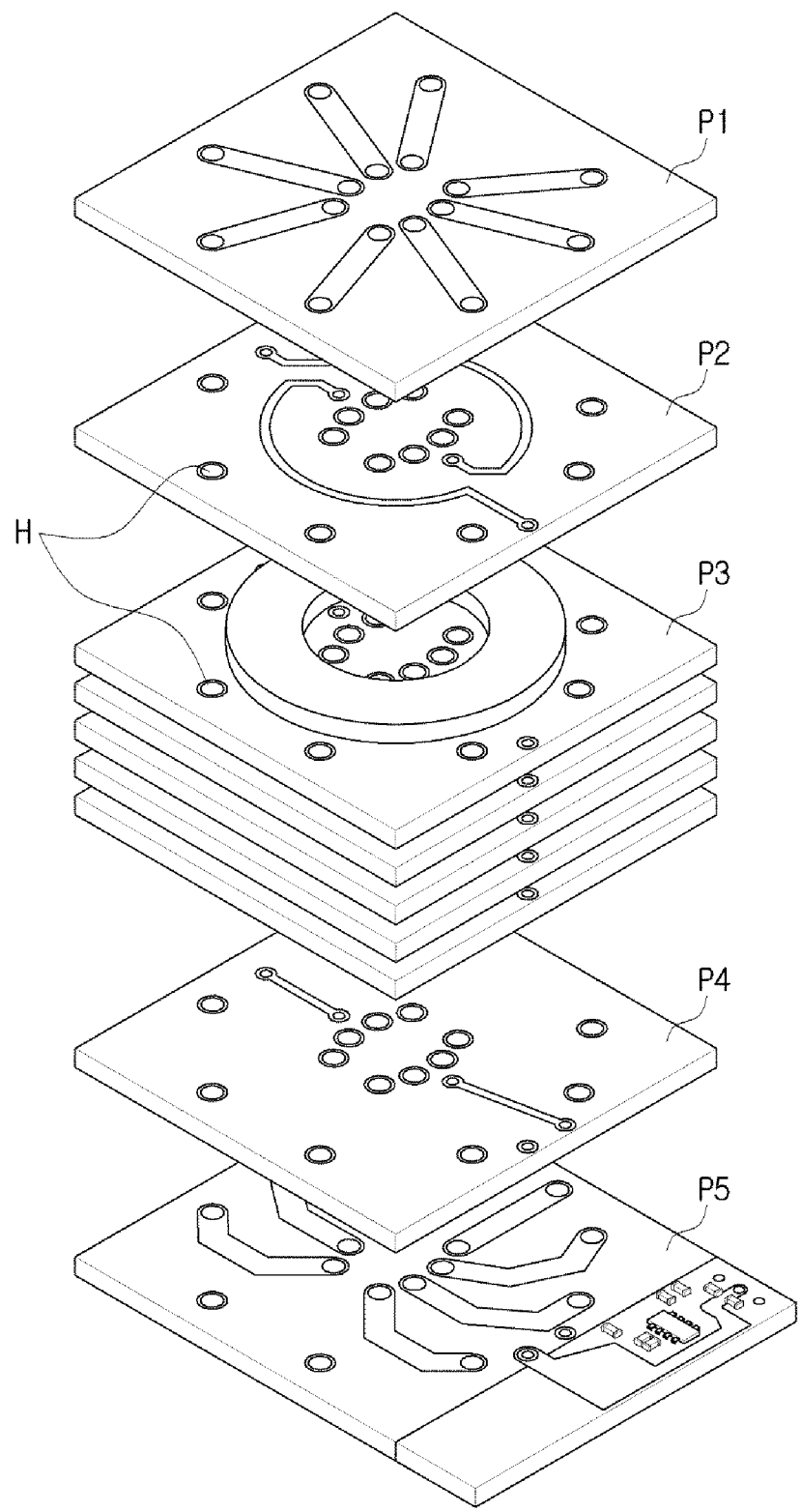
FIGS. 7A and 7B are exemplary views illustrating the vehicle electronic module in accordance with an exemplary embodiment of the present disclosure.
Figure 7B:
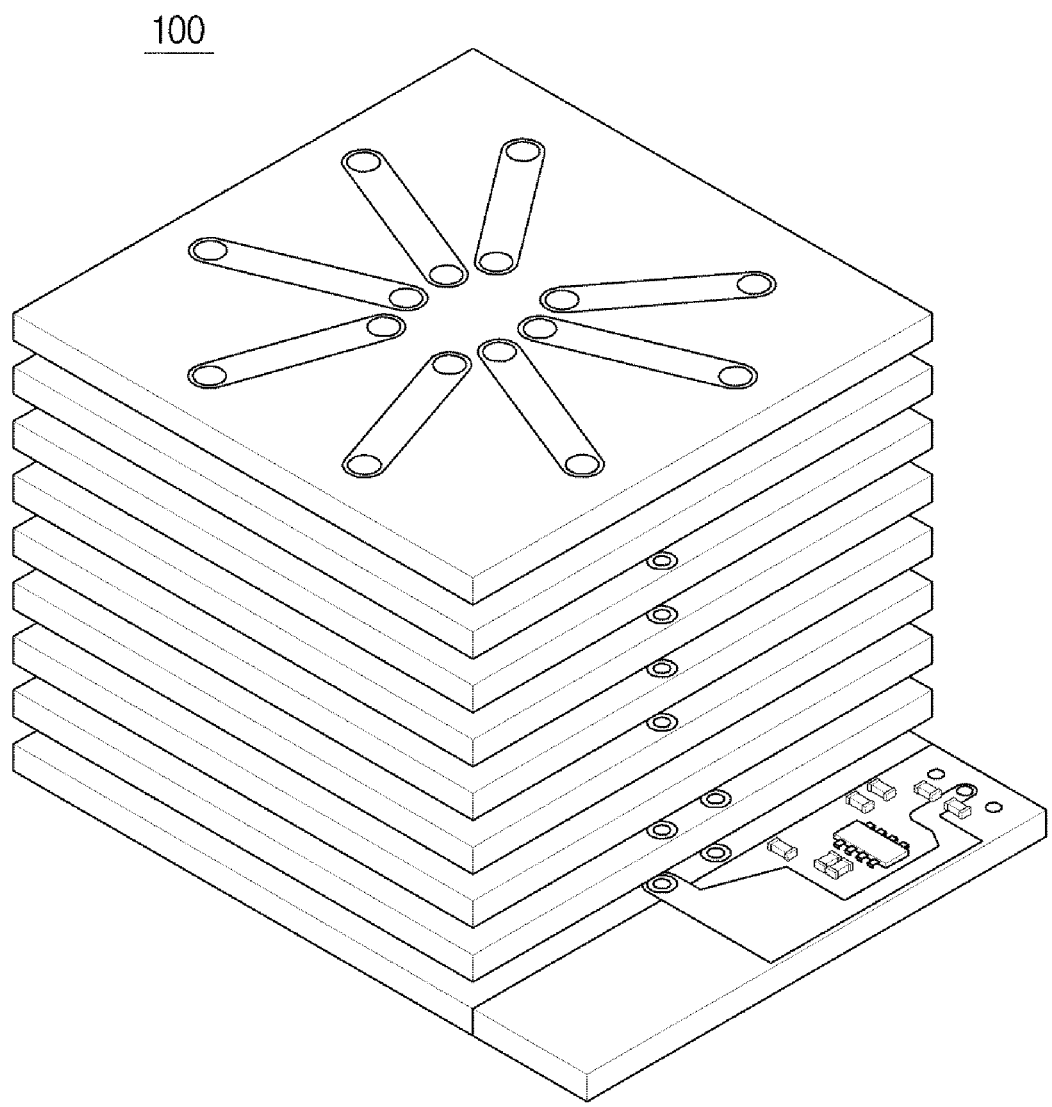
Figure 8A:
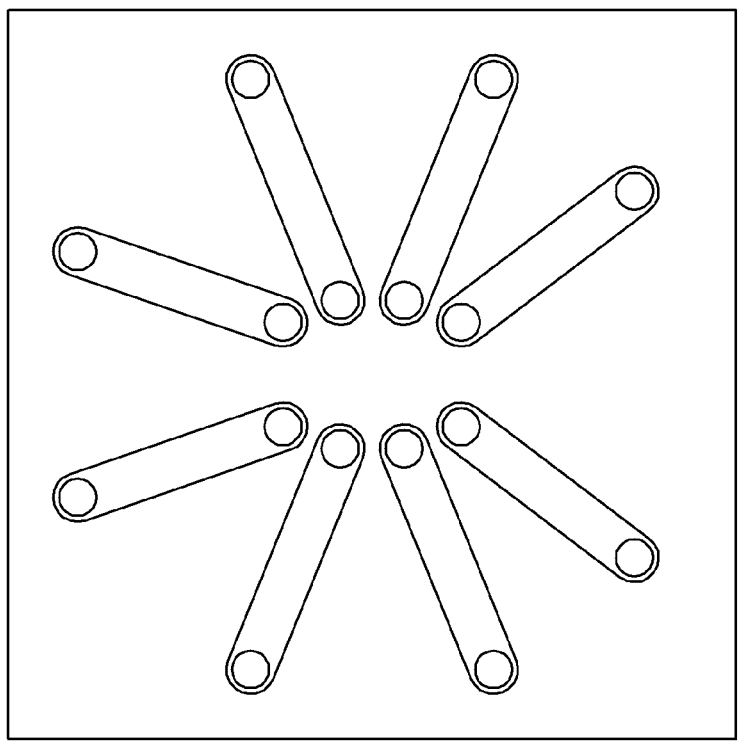
FIGS. 8A to 8E are exemplary exploded views illustrating the vehicle electronic module in accordance with an exemplary embodiment of the present disclosure.
Figure 8B:
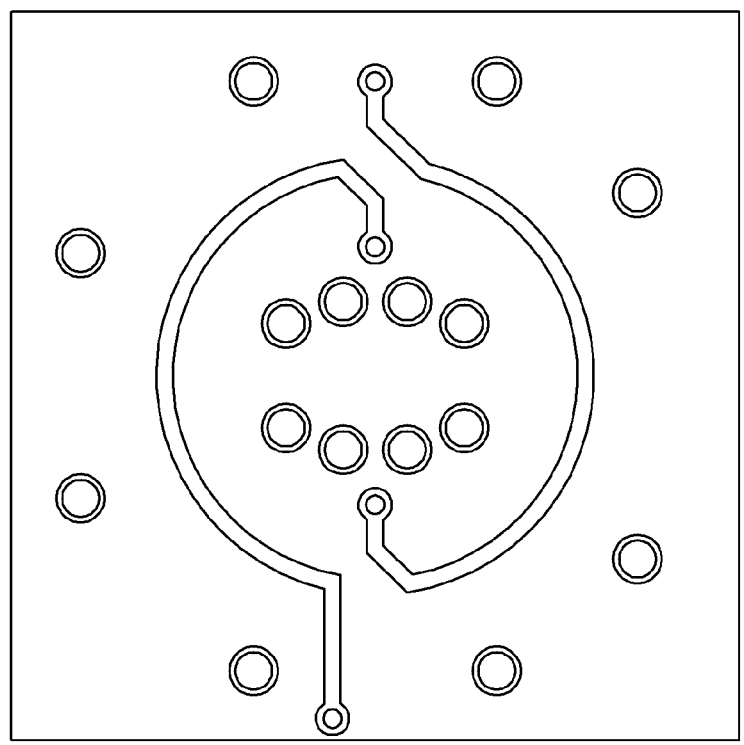
Figure 8C:
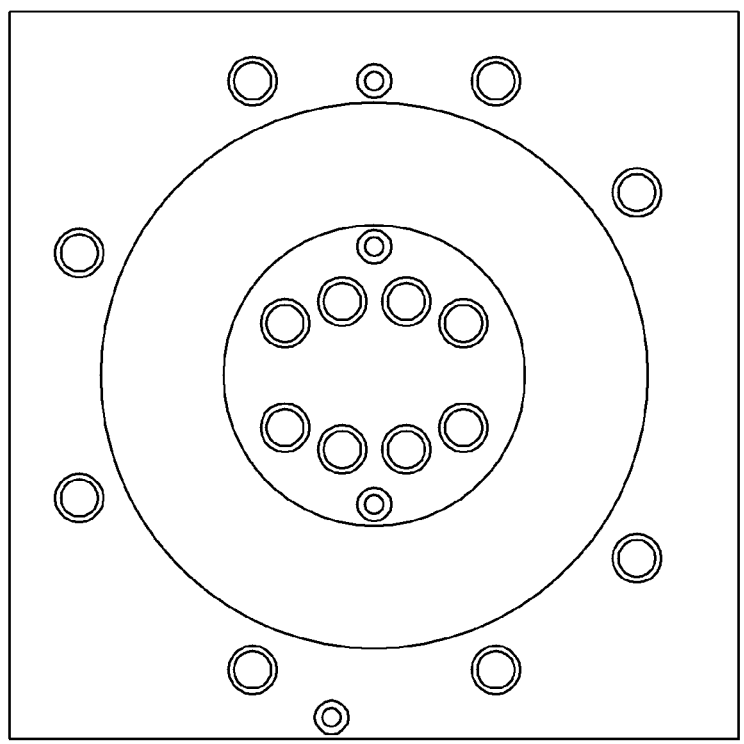
Figure 8D:
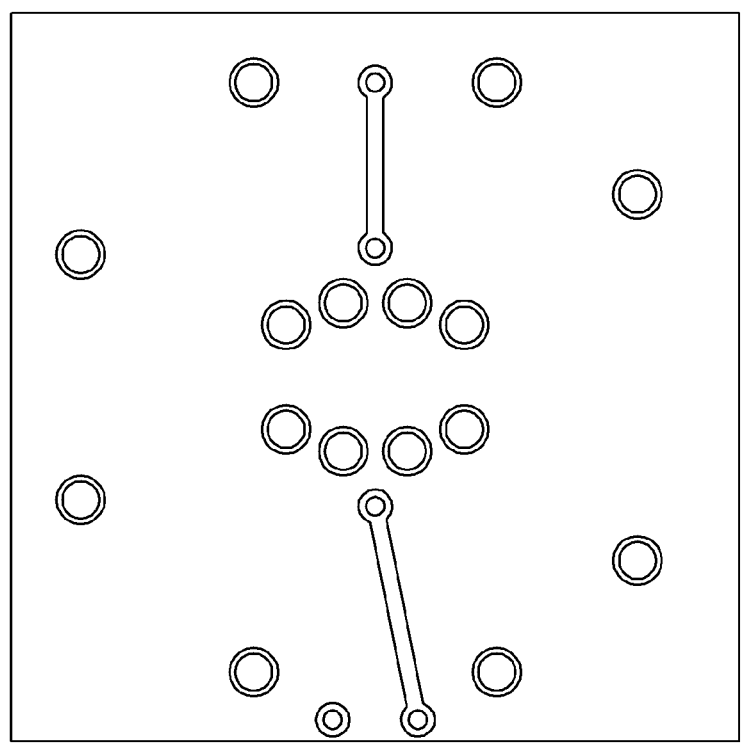
Figure 8E:
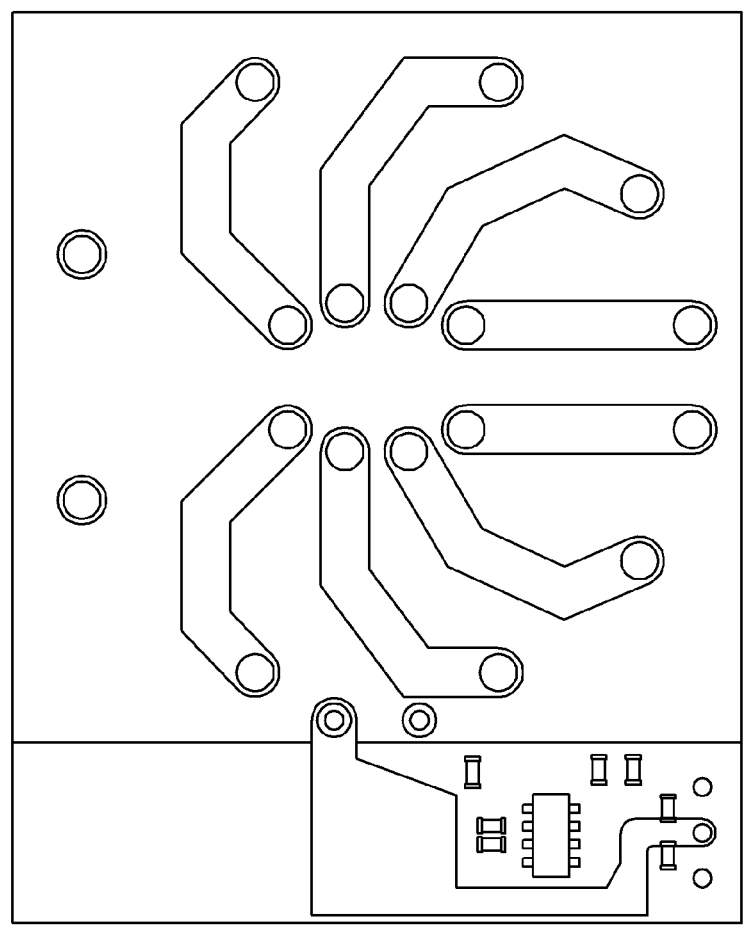

FIGS. 7A and 7B show the vehicle electronic module 100 according to an exemplary embodiment of the present disclosure. Referring to FIG. 7A, five PCBs may be provided. Although FIG. 7A shows five PCBs, according to an exemplary embodiment of the present disclosure, an uppermost PCB P1 and a lowermost PCB P5 may be formed as a second PCB that forms the second winding, and a middle PCB P3 may electrically connect the first and second windings of the offset unit 103 to each other. The remaining PCBs P2 and P4 may form the first winding. The sensor 101 and the controller 102 may be disposed on the lowermost PCBs P5. In FIG. 7A, for convenience of description, the PCBs are referred to as first to fifth substrates in the order from the top.

As shown in FIG. 7A, the vehicle electronic module 100 may be formed in a stacked structure, and the first and fifth substrates P1 and P5 may form the second winding. Additionally, the second and fourth substrates P2 and P4 may form the first winding. The aperture structures H, may electrically connect substrates to each other, may be disposed in each substrate. The third substrate P3 may have the aperture structures H for connecting the first and fifth substrates P1 and P5 and connecting the second and fourth substrates P2 and P4. Input and output windings of the offset unit 103 may be formed through the structure. The core may be disposed within the third substrate P3.

The second and fourth substrates P2 and P4, which are the input winding of the offset unit 103 and the first winding, may be connected to an output terminal of the operational amplifier of the controller 102 through the aperture structure H. The third substrate P3 may have apertures for connecting the first and fifth substrates P1 and P5 and connecting the second and fourth substrates P2 and P4. Accordingly, the first and second windings may be formed. The core may be inserted into the stacked third substrate and may be formed by stacking the PCBs up to the level of a height of the core.

FIG. 7B is an exemplary view illustrating an assembly of the substrates illustrated in FIG. 7A. In the exemplary embodiment, although conductors are inserted into the aperture structure of each PCB to connect the transformer windings, the PCB layers may be connected to each other by utilizing a multilayer PCB manufacturing scheme when the PCB is manufactured. The stacked structure of the PCBs shown in FIGS. 7A and 7B is an example for describing the operation of the exemplary embodiment, and is not limited thereto.

FIGS. 8A to 8E are exemplary detailed views of the vehicle electronic module 100 according to an exemplary embodiment of the present disclosure. FIGS. 8A to 8E each show a configuration of the PCB for each layer of the vehicle electronic module 100 of the present disclosure. Each PCB may form the offset unit 103 of the vehicle electronic module 100. In particular, an electronic circuit board shown in FIG. 8E may include the sensor 101 and the controller 102. The configurations of the PCBs shown in FIGS. 8A to 8E may be formed differently in accordance with the turn ratio of the offset unit 103.

Figure 9A:
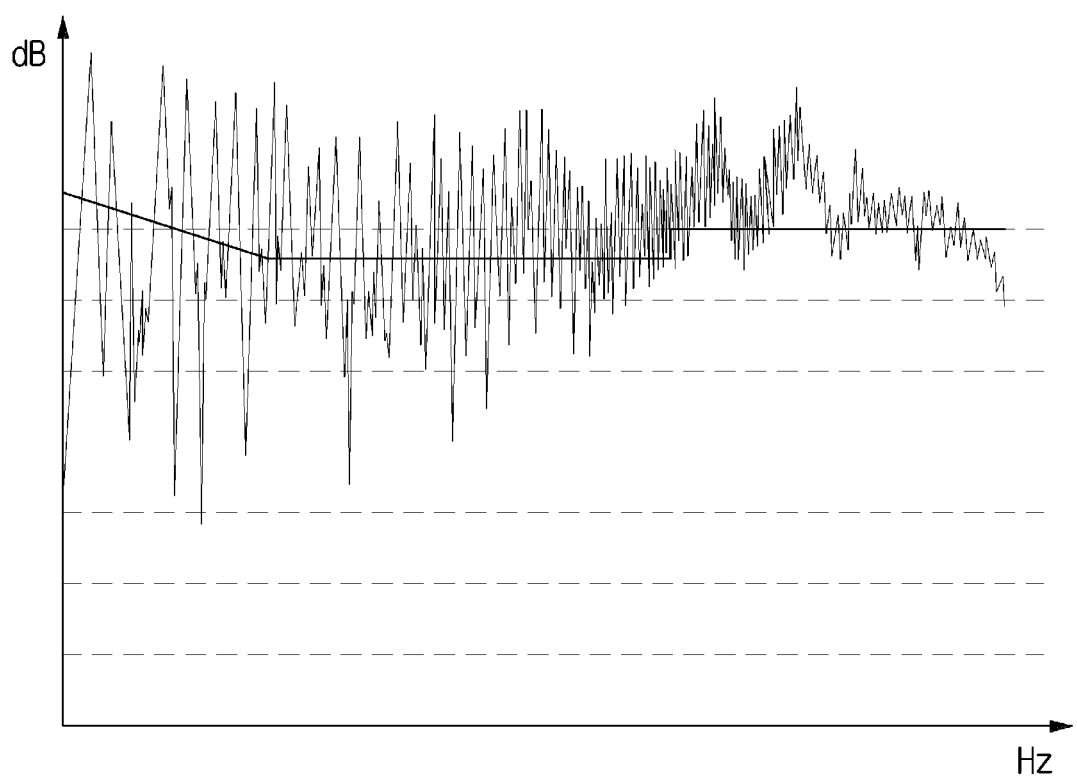
FIGS. 9A to 9C are exemplary graphs illustrating noise reduction results in accordance with another exemplary embodiment of the present disclosure.
Figure 9B:
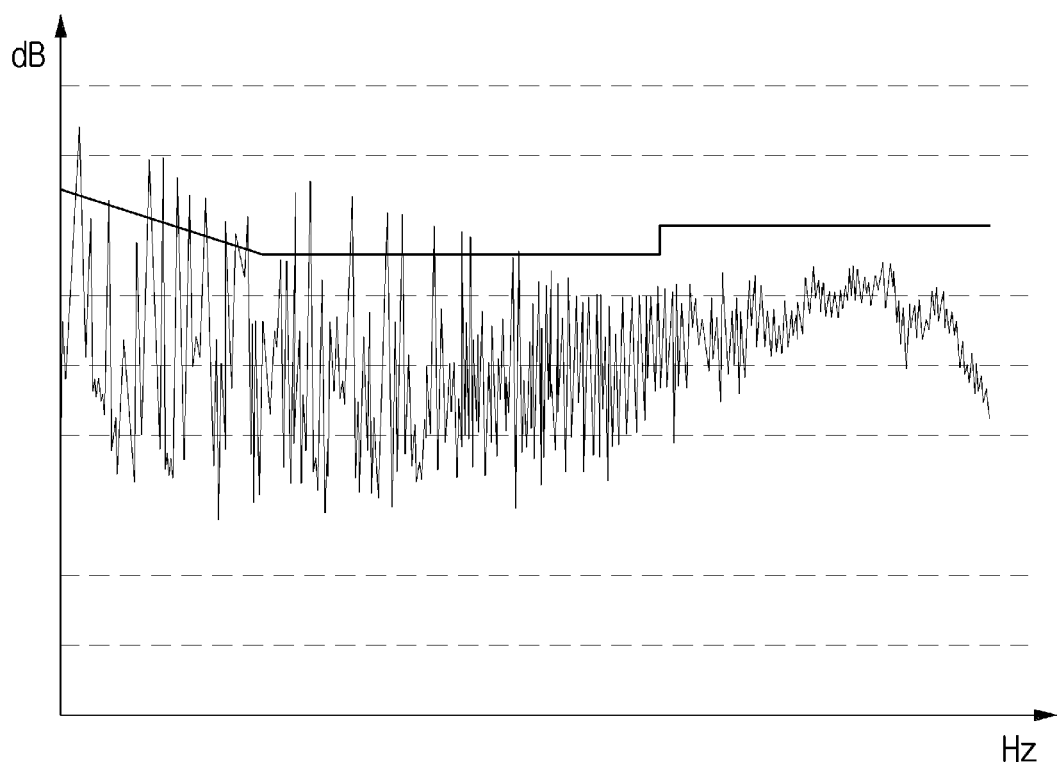
Figure 9C:
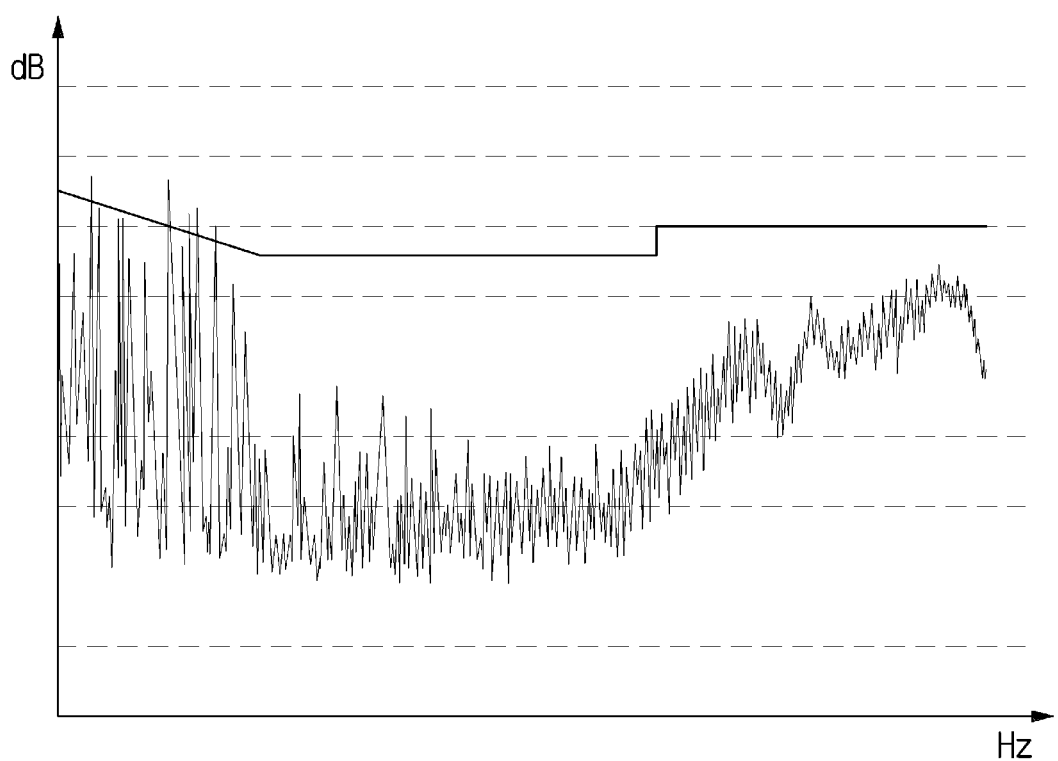

FIGS. 9A to 9C are exemplary graphs illustrating noise reduction results in accordance with another exemplary embodiment of the present disclosure. FIG. 9A shows an experimental result when the vehicle electronic module 100 is not applied. FIG. 9B shows an experimental result when the vehicle electronic module 100 is applied. FIG. 9C shows an experimental result when an additional passive component is used. In the graphs, an X-axis represents a frequency value and a Y-axis represents intensity of noise.

When compared to FIGS. 9A and 9B, the noise may be reduced by about 20 dB when the vehicle electronic module 100 is applied. Additionally, when compared to FIGS. 9A and 9C, the noise may be reduced by about 40 dB. When compared to FIGS. 9A and 9C, FIG. 9C shows an improved noise reduction effect in a specific frequency range. When a passive component is used to obtain a noise reduction property in a frequency range including a low frequency band, a size of the component may be enlarged. Therefore, when the vehicle electronic module 100 of the present disclosure is applied, a noise reduction effect in a frequency band where additional attenuation is required may be secured, and when combined with an additional passive component having a reduced size and used for reducing the common mode, a more improved noise reduction effect may be obtained.

As is apparent from the above description, in a vehicle electronic module and a vehicle having the same according to the exemplary embodiment of the present disclosure, an offset unit of an EMI filter module may be replaced with a PCB winding structure. Accordingly, productivity of the vehicle electronic module may be improved and size thereof may be reduced.

The disclosed exemplary embodiments have been described above with reference to the accompanying drawings. It will be understood by those skilled in the art that various exemplary embodiments may be made in other forms than the disclosed exemplary embodiments without departing from the spirit and essential characteristics of the present disclosure. The disclosed exemplary embodiments are illustrative and should not be construed as limiting.

What is claimed is:

1. An electronic module, comprising:
   a sensor configured to detect common mode electromagnetic interference (EMI) noise of a power line;
   an offset unit configured to transmit an offset voltage for removing the EMI noise to the power line; and
   a controller configured to generate the offset voltage that corresponds to the EMI noise detected by the sensor,
   wherein the sensor and the offset unit are formed in a stacked structure of a printed circuit board (PCB).

2. The electronic module according to claim 1, wherein the offset unit includes:
   a first winding configured to receive the offset voltage generated by the controller;
   a second winding configured to transform the offset voltage and supply the transformed voltage to the power line; and
   a core configured to electrically connect the first winding and the second winding.

3. The electronic module according to claim 2, wherein the offset unit includes:
   a first PCB that forms the first winding;
   a second PCB that forms the second winding; and
   a third PCB configured to electrically connect the first winding and the second winding.

4. The electronic module according to claim 2, wherein the controller is disposed on a PCB with the first winding or the second winding.

5. The electronic module according to claim 1, wherein the controller includes a voltage or current amplifying component that is an operational amplifier or a transistor.

6. The electronic module according to claim 1, wherein the controller includes a resistor and is configured to generate the offset voltage that corresponds to the EMI noise based on the resistor.

7. The electronic module according to claim 1, wherein a wiring structure is formed on the PCB based on a turn ratio of the offset unit.

8. The electronic module according to claim 1, wherein the at least one PCB includes an aperture structure configured to electrically connect the PCB and a second PCB.

9. The electronic module according to claim 1, further comprising a passive component configured to remove the EMI noise.

10. A vehicle, comprising:
    a power source configured to supply power to the vehicle;
    a power line configured to transmit the power supplied from the power source to the vehicle;
    a sensor configured to detect electromagnetic interference (EMI) noise of the power line;
    an offset unit configured to transmit an offset voltage for removing the EMI noise to the power line; and
    a controller configured to generate the offset voltage that corresponds to the EMI noise detected by the sensor,
    wherein the sensor and the offset unit are formed in a stacked structure of a printed circuit board (PCB).

11. The vehicle according to claim 10, wherein the offset unit includes:
    a first winding configured to receive the offset voltage generated by the controller;
    a second winding configured to transform the offset voltage and supply the transformed voltage to the power line; and
    a core configured to electrically connect the first winding and the second winding.

12. The vehicle according to claim 11, wherein the offset unit includes:
    a first PCB that forms the first winding;
    a second PCB that forms the second winding; and
    a third PCB configured to electrically connect the first winding and the second winding.

13. The vehicle according to claim 11, wherein the controller is disposed on one PCB together with the first winding or the second winding.

14. The vehicle according to claim 10, wherein the controller includes a voltage or current amplifying component that is an operational amplifier or a transistor.

15. The vehicle according to claim 10, wherein the controller includes a resistor and is configured to generate the offset voltage that corresponds to the EMI noise based on the at least one resistor.

16. The vehicle according to claim 10, wherein a wiring structure is formed on the PCB based on a turn ratio of the offset unit.

17. The vehicle according to claim 10, wherein the PCB includes an aperture structure configured to electrically connect the PCB to a second PCB.

18. The vehicle according to claim 10, further comprising a passive component configured to remove the EMI noise.

* * * * *